United States Patent
Sun (10) Patent No.: US 8,911,932 B2
(45) Date of Patent: Dec. 16, 2014

(54) PHOTO-IMAGEABLE HARDMASK WITH POSITIVE TONE FOR MICROPHOTOLITHOGRAPHY

(76) Inventor: Sam Xunyun Sun, Columbia, MO (US)

(\*) Notice: Subject to any disclaimer, the term of this patent is extended or adjusted under 35 U.S.C. 154(b) by 867 days.

(21) Appl. No.: 12/758,419

(22) Filed: Apr. 12, 2010

(65) Prior Publication Data

US 2010/0261097 A1 Oct. 14, 2010

Related U.S. Application Data

(60) Provisional application No. 61/168,694, filed on Apr. 13, 2009.

(51) Int. Cl.
*G03F 7/075* (2006.01)
*G03F 7/039* (2006.01)
*G03F 7/20* (2006.01)
*G03F 7/30* (2006.01)
*G03F 7/36* (2006.01)

(52) U.S. Cl.
USPC ........ 430/326; 430/270.1; 430/311; 430/313; 430/317; 430/318; 430/323; 430/330

(58) Field of Classification Search
None
See application file for complete search history.

(56) References Cited

U.S. PATENT DOCUMENTS

| 8,728,710 B2 * | 5/2014 | Sun | 430/311 |
| 2006/0105181 A1 * | 5/2006 | Lin et al. | 428/447 |
| 2009/0291389 A1 * | 11/2009 | Allen et al. | 430/270.1 |

\* cited by examiner

*Primary Examiner* — Sin J. Lee (57) ABSTRACT

Disclosed are the deactivation mechanism and chemistry platforms that make high-silicon hardmask films photo-imageable like positive-tone photoresist for microphotolithography. The deactivation mechanism requires a catalyst to promote crosslinking reactions, and a photoacid generator to deactivate the catalyst. The initial hardmask films are soluble in developers. If not radiated, films become insoluble in developers due to crosslinking reactions promoted by catalyst. If radiated, films remain soluble in developers due to deactivation of catalyst by photoacid generator. Compositions of positive-tone photo-imageable hardmask based on the chemistry of polysiloxane and polysilsesquioxanes are disclosed as well. Also disclosed is a method of modifying polysiloxane and polysilsesquioxane films for controlled diffusion of catalysts, photoacid generators, and quenchers. Further disclosed are processes of using photo-imageable hardmasks to create precursor structures on semiconductor substrates with or without an intermediate layer.

8 Claims, 6 Drawing Sheets

PHOTO-IMAGEABLE HARDMASK WITH POSITIVE TONE FOR MICROPHOTOLITHOGRAPHY

CROSS-REFERENCE TO RELATED APPLICATIONS

This application claims the priority benefit of a provisional application entitled SELF-IMAGING HARD MASK WITH POSITIVE TONE FOR PHOTOLITHOGRAPHY with application No. 61/168,694 filed Apr. 13, 2009 incorporated by reference herein.

BACKGROUND OF THE INVENTION

1. Field of the Invention

The present invention relates in general to the process of microphotolithography in which a photosensitive layer and an anti-reflective coating are involved for forming structural patterns on semiconductor substrates.

2. Description of Prior Art

Photoresist is the foremost vital thin coating in the microphotolithography process of creating fine precursor structures on semiconductor substrates. When exposed to ultra-violet radiations, constituents of the coating go through a series of photochemical reactions. The photochemical reactions cause significant property changes to the coating. The coating becomes either more or less soluble in alkaline developers. The solubility contrast before and after exposure of a photoresist is the foundation of photolithographic delineating.

In the past, many polymer chemistries have been explored as photoresist platforms to produce solubility contrast to meet requirements of photolithography at different eras of the technology. One of the well known platforms is the combination of diazonaphthoquinone (DNQ) photosensitizer and Novolac resin. In this chemistry, DNQ inhibits solubility of Novolac polymer coating in alkaline developers, but greatly enhances the dissolution rate of the film upon exposure to UV radiations. Although the exact chemical mechanism of DNQ sensitization is quite ambiguous, this photoresist prevailed in the era of h-, g- and i-line photolithography.

One of the shortcomings of the DNQ-Novolac chemistry is low sensitivity to radiations. One photon strike promotes at most one molecular transformation. The low photon efficiency was not a problem to high-power mercury-vapor lamps. However, the low photosensitivity hindered extension of the DNQ-Novalac photoresist to the next generation lithography with laser radiations. Laser was not able to deliver adequate radiation dose to activate the photoresist with reasonable exposure duration. The DNQ-Novolac chemistry was then replaced by a so-called chemically amplified (CA) platform.

The concept of chemically amplified photoresist was first studied and advocated by C. Grant Willson, Jean Frechet and Hiroshi Ito in the early 1980s. The chemistry platform requires coating polymers to have either phenolic or carboxylic groups that are protected by a labile moiety such as tertiary butoxycarbonyl (t-BOC). The photoresist compositions require a photoacid generator, such as onium salts, as well. Initial coatings of such photoresist are not soluble in alkaline developers since the phenolic or carboxylic groups are protected and inactivated. When exposed to UV laser radiations, the photoacid generators yield strong acid in the film. Acid is a very efficient catalyst to hydrolyzation reactions that cleave labile groups off the polymer molecules. Loss of the labile groups reveals phenolic or carboxylic groups that make the coating readily soluble in alkaline developers. This photochemical mechanism was an innovative way to achieve solubility contrast of a coating with a positive tone at the time.

Due to the nature of catalyzation, one photon is capable of promoting several secondary reactions to intensify the chemical difference between exposed and unexposed films. As the inventors put, the radiation energy was "chemically amplified". Exposure dosage required for this type of photoresist is fractional to that for the DNQ-Novolac counterpart. The hydrolyzation reaction was later widely referred to as "de-protection", because the acidic groups on the polymer sidechains was de-protected when the labile groups were cleaved.

Many types of polymers and labile groups have been investigated as options for commercial photoresist. For example, polyhydroxystyrene resin was widely used for KrF (a laser of 248 nanometers) photoresist, while polymethacrylate resins were selected for ArF (a laser of 193 nanometers) photoresist. The labile groups have been primarily t-BOC and acetyl. Nevertheless, the basic chemistry, that is polymers with acidic moieties protected by labile groups, remained the same. Photoresist that is based on the de-protection mechanism has been the only choice for KrF and ArF photolithography for over twenty years. The commercial success is primarily due to lack of competing technologies, other than perfection of the photoresist. There have not been reports on alternative photochemical mechanism that is capable of generating solubility contrast of a coating in a positive tone before the present disclosure.

Many intrinsic shortcomings of the de-protection photoresist are widely recognized. Inadequate resistance to plasma etch is one of the shortcomings. The polymethacrylate-based photoresist is not able to prevent plasma from etching the substrate without manipulating the photolithographic process.

Figure 1A:
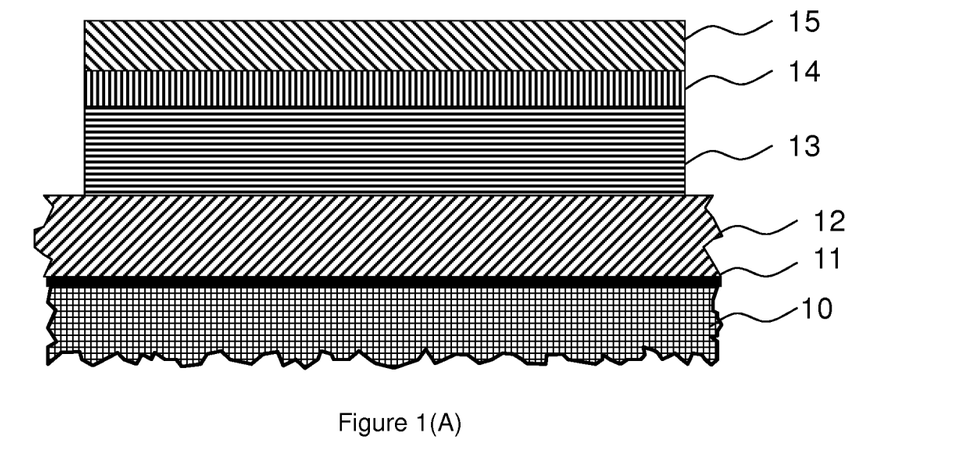
FIG. 1(A): Trilayer stack of prior art.
Figure 1B:
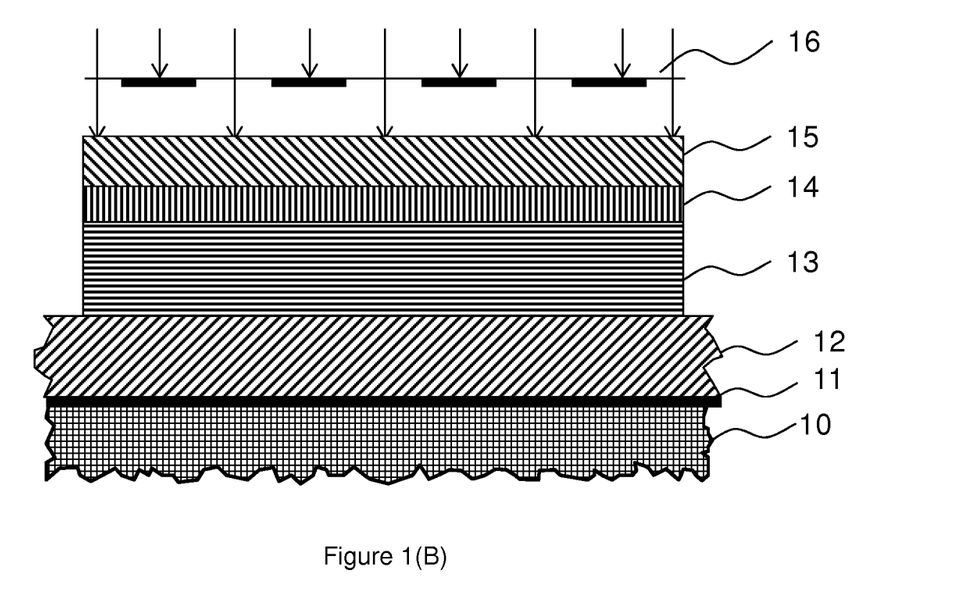
FIG. 1(B): Trilayer of prior art being exposed to radiations with a photomask.
Figure 1C:
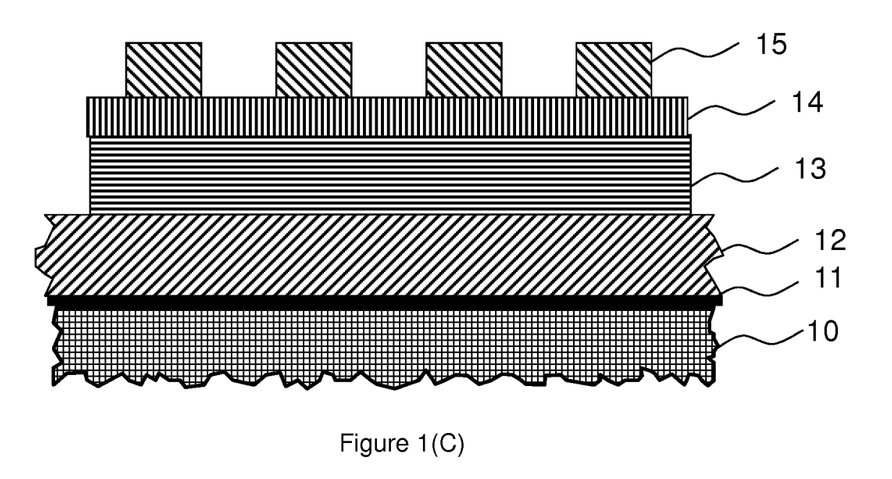
FIG. 1(C): Cross-section view of photoresist patterns of prior art.
Figure 1D:
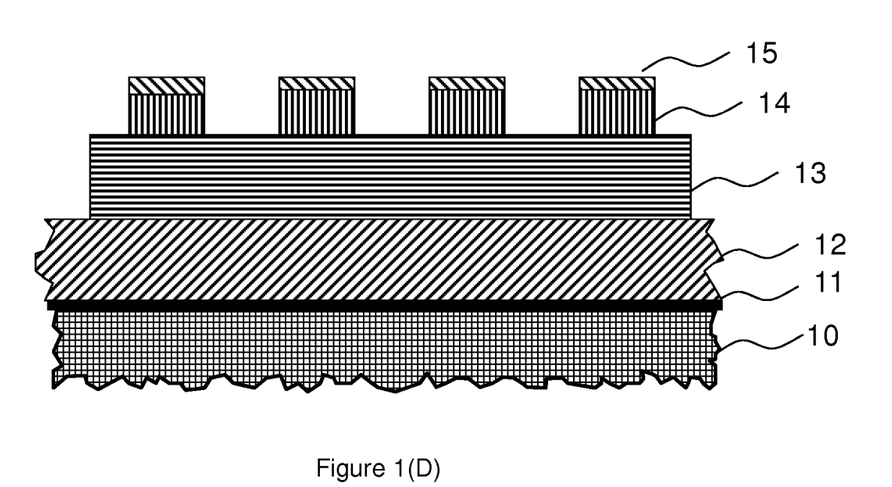
FIG. 1(D): Cross-section view of hardmask patterns with residual photoresist of prior art formed by plasma etch.
Figure 1E:
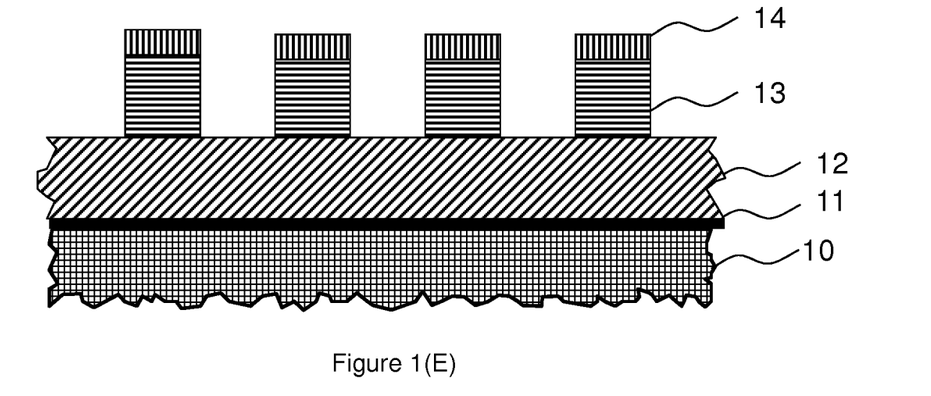
FIG. 1(E): Cross-section view of patterns on intermediate layer with residual hardmask of prior art formed by plasma etch.
Figure 1F:
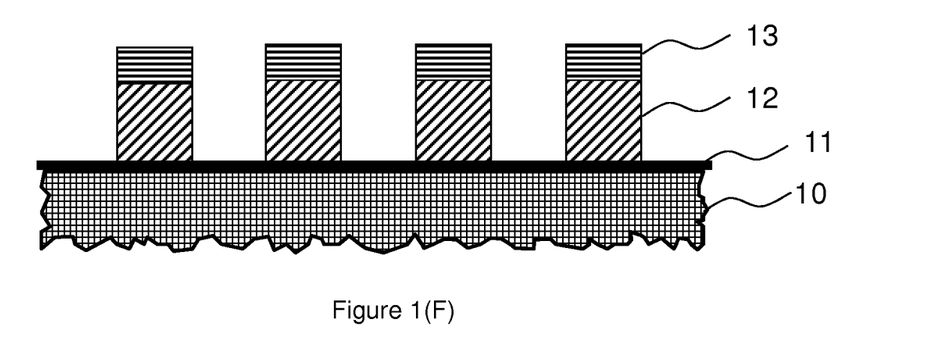
FIG. 1(F): Cross-section view of patterns on substrate with residual intermediate layer of prior art formed by plasma etch.

A well-known manipulation is the so-called "trilayer" process. FIG. 1(A) shows film stack for the trilayer process. The gimmick of trilayer process is to imbed a hardmask (14) between photoresist (15) and intermediate layer (13). Intermediate layer (13) is coated on a substrate (12) that needs to be patterned. There is an etch-stop layer (11) beneath the substrate. The carrier of all the films is a silicon wafer (10). Hardmask (14) is a thin layer of spin-coated composition comprising of silicon-containing resins. The silicon-containing film is normally thinner than photoresist (15), while the intermediate layer (13) is much thicker than photoresist (15). The photoresist (15) is exposed to radiations through a photomask (16), as illustrated in FIG. 1(B). Photoresist patterns in FIG. 1(C) are formed after development. Hardmask (14) etches faster than photoresist if appropriate plasma chemistry is selected. As shown in FIG. 1(D), when hardmask (14) in open spaces is quickly etched through, there is still photoresist (15) left on pattern tops blocking the plasma. Intermediate layer (13) is a coating of organic polymers. The widely used polymer is Novalac resin. Intermediate layer (13) etches multiple times faster than hardmask (14) by oxygen-containing plasmas. Therefore, intermediate layer (13) can be multiple times thicker than hardmask (14) or photoresist (15). FIG. 1(E) shows that hardmask ((14) is sufficient as a template for etching intermediate layer (13). Intermediate layer (13) is equivalent to the older DNQ-Novolac photoresist in terms of resistance to plasma etch. Therefore, patterns on the intermediate layer (13) can be easily transferred to substrate (12) by plasma etch (see FIG. 1(F)).

The outcome of the trilayer maneuver is that etch capability of photoresist is amplified multiple times. This manipulated amplification, however, is not only complicated and costly, but also prone to defectivity propagation.

Photoresist compositions with silicon-containing resins have been long desired to improve etch performance. There was no shortage of attempts to intuitively extend the de-protection concept to the silicon chemistry. Some inventions in this regard disclosed polymers with silicon in backbones and hydrocarbon functional groups on side chains (For example, U.S. Pat. Nos. 7,510,816 B2, 6,632,582 B2, 7,439,010 B2, and 7,485,407 B2). Others disclosed methacrylate polymers with silicon moieties on side chains (For example, U.S. Pat. No. 4,481,049). In any cases, a large portion of the polymers has to be hydrocarbon functional groups for the de-protection reaction to take place. Therefore, silicon content in those polymers can hardly reach 20%. In fact, silicon photoresist has never prevailed. The failure of those attempts is in two folds: (1) Silicon is not high enough to significantly improve etch resistance; (2) Delineating performance is not good enough to replace the hydrocarbon counterpart.

In contrast, the new mechanism of the present invention does not require organic functional groups. Both backbones and sidechains are consisted of "—O—Si—". Elemental silicon makes up as high as 40% of the polymer films by weight. The disclosed compositions make excellent hardmask films as far as etch resistance is concerned.

In summary, photoresist of prior art is outstanding in delineating, but inadequate for masking. Hardmasks of prior art are superior for masking, but not photo imageable. Therefore, the two often have to be used in conjunction for photolithography. The attempts to enhance etch performance of photoresist have failed in the past. To make hardmasks self imageable with positive tone has been unconceivable without the new deactivation mechanism of the present invention. The present invention discloses methods and compositions that turn hardmask self imageable like photoresist. The self-imageable hardmask has the combined functionalities of photoresist and hardmask. Photolithographic process is simplified from trilayer to bilayer, or to single layer. Cost is significantly reduced.

SUMMARY OF THE INVENTION

This summary provides a simplified description of the invention as a basic overview, and does not provide detailed processes and all the critical elements of the invention. This brief overview should not be used to constrain the full scope of the invention.

Photo-imageable hardmask (PIHM) of the present invention has a positive response to UV radiations, i.e. radiations make films soluble or dispersible in organic solvents or alkaline aqueous solutions. Photochemical reactions of the present invention are not based on the de-protection concept of prior art, but a novel "deactivation" mechanism. Deactivation reactions take place between a catalyst and a photoacid generator (PAG). Initial films of the photo-imageable hardmask are readily soluble or dispersible in organic solvents or alkaline aqueous solutions. If the films are not exposed to radiations, the catalyst promotes condensation reactions to form molecular networks of the resin. The condensation reactions may take place at ambient or higher temperatures. The molecular network prevents the films from dissolving or dispersing in organic solvents or alkaline aqueous solutions. If the films are adequately exposed to radiations, the catalyst is deactivated by photo-generated acid. The deactivation can be a neutralization reaction. Water or volatile species may be generated from deactivation reactions. Deactivated catalyst loses its ability to promote condensation reactions, and therefore, no molecular network of the resin is formed. Lack of molecular network leaves the films, like the initial films, soluble or dispersible in organic solvents or alkaline aqueous solutions.

Resins in compositions of the positive-tone photo-imageable hardmask of the present invention are consisted of polysiloxanes and polysilsesquioxanes that are prepared from monomers with molecular formulas of (A), (B) and (C).

In formulas (A), (B) and (C), R is selected from the groups consisting of hydrogen and $C_1$-$C_4$ alkyls, and $R_1$ is selected from the groups consisting of alkyl, aryl, alkene, alicyclic groups, epoxy-alkyl, and epoxy-cycloalkyl.

Out of the monomers, the derived siloxane and silsesquioxane polymers are consisted of linear structures (D) and network structures (E).

In molecular structures (D) and (E), R is selected from the groups consisting of hydrogen and $C_1$-$C_4$ alkyls, and $R_1$ is selected from the groups consisting of alkyl, aryl, alkene, alicyclic, epoxy-alkyl, and epoxy-cycloalkyl. Molar ratio of OR to $R_1$ in structure (E) is less than 0.2 in the final polymers.

Structures (D) and (E) are simplified expressions to depict the polymer molecules. Due to the complexity and diversity of molecular structures of polysiloxanes and polylilsesquioxanes, those simplified expressions should not be taken as exact templates to confine selections of the resin polymers. The polymers should be defined by structures (D) and (E) together with information of monomers and polymerization process.

The polymers are responsible for forming films and resisting plasma etch. Besides resin polymers, other essential constituents of compositions of positive-tone photo-imageable hardmask include film-modifier, catalyst, PAG, quencher, additives, and solvents. Solid chemicals constitute 1%-10% of the compositions. Dry film thickness of photo-imageable hardmasks ranges from 20 to 100 nanometers. Content of elemental silicon in dry films is from 30% to 41% by weight, and more commonly from 35% to 40% by weight.

The photo-imageable hardmask with such high silicon is capable of creating precursor patterns on semiconductor substrates with or without an intermediate layer. Intermediate layer is a coating of hydrocarbon polymers, multiple times thicker than the photo-imageable hardmask. Intermediate layer serves as a mask to the substrates when etched by plasma. It functions as an antireflective coating as well. If intermediate layer is not used, a thin antireflective coating is necessary to control reflection of radiations from substrates. Antireflective coatings have no function of masking plasmas.

In one embodiment, positive-tone photo-imageable hardmask was used in conjunction with an intermediate layer to create precursor structures on semiconductor substrates for fabricating integrated circuit. The intermediate layer was formed by spin-coating a composition on a polysilicon substrate. The intermediate layer had a thickness of 300 nanometers after being cured on a hot surface. A film of photo-imageable hardmask was formed on top of the intermediate layer by spin-coating a composition. The film was dried by a post-application bake. The dried film had a thickness of 56±5 nanometers. The photo-imageable hardmask was exposed to radiations with a wavelength of 193 nanometers through a photomask. A post-exposure bake was followed. The photo-imageable hardmask was then developed in a tetramethylammonium hydroxide aqueous solution. The radiated regions of the film dissolved, and images formed. The images were etched to the intermediate layer by oxygen-containing plasma. The images on the intermediate layer were then etched to the polysilicon substrate by chlorine-containing plasma.

In another embodiment, positive-tone photo-imageable hardmask was used in conjunction with a thin antireflective coating to create precursor structures on semiconductor substrates for fabricating integrated circuit. The antireflective coating of 32 nanometers was formed by spin-coating and thermally curing a composition on a polysilicon substrate. A film of photo-imageable hardmask was formed on top of the thin antireflective coating by spin-applying a composition. The film was dried by a post-application bake. The dried film had a thickness of 56±5 nanometers. The photo-imageable hardmask was exposed to radiations with a wavelength of 193 nanometers through a photomask. A post-exposure bake was followed. The photo-imageable hardmask was then developed in a tetramethylammonium hydroxide aqueous solution. The radiated regions of the film dissolved, and images formed. The images were etched to the polysilicon substrate by oxygen- and chlorine-containing plasma. The antireflective coating was etched through.

DETAILED DESCRIPTION OF THE PREFERRED EMBODIMENTS

Film-forming polymers in compositions of the positive-tone photo-imageable hardmask of the present invention are consisted of polysiloxanes and polysilsesquioxanes that are prepared from monomers with molecular formulas of (A), (B) and (C).

In formulas (A), (B) and (C), R is selected from the groups consisting of hydrogen and $C_1$-$C_4$ alkyls, and $R_1$ is selected from the groups consisting of alkyl, aryl, alkene, alicyclic, epoxy-alkyl, and epoxy-cycloalkyl.

Resin is formed by polymerizing monomers with molecular formulas of (A), (B) and (C). Multiple monomers with various R and $R_1$ groups are usually required to form each resin appropriate for photo-imageable hard mask. The polymerization is a condensation reaction under catalyzation. Acetic acid is one of the appropriate catalysts. Volatile alkanols are formed from the condensation reactions. The reactions take place in the medium of organic solvents. Propylene glycol methyl ether (PGME) and propylene glycol methyl ether acetate (PGMEA) are among preferred solvents. Reaction temperature is controlled preferably between 80° C. and 110° C., and more preferably between 90° C. and 100° C. The alkanols are distilled out the reactor as the reactions proceed. The distillate may include catalyst, water and solvents as well. A steady nitrogen stream flushes through the reactor to assist distillation. Polymerization is stopped when distillation is completed. Reaction time is typically from 2 to 8 hours. Weight-average molecular weight of the derived polysiloxane and polysilsesquioxane are preferably less than 50,000 grams per mole, and more preferably less than 10,000 grams per mole.

The polysiloxane and polysilsesquioxane resin is consisted of linear structures (D) and network structures (E).

In molecular structures (D) and (E), R is selected from the groups consisting of hydrogen and $C_1$-$C_4$ alkyls, and $R_1$ is selected from the groups consisting of alkyl, aryl, alkene, alicyclic groups, epoxy-alkyl, and epoxy-cycloalkyl. Multiple hydroxyl groups are preferred on each molecular unit of the polymers.

Structures (D) and (E) are simplified expressions to depict the polymer molecules. Due to the complexity and diversity of molecular structures of polysiloxanes and polylilsesquioxanes, those simplified expressions should not be taken as exact templates to confine selections of the resin polymers. The polymers should be defined by structures (D) and (E) together with information of monomers and polymerization process.

Beside the polysiloxane and polysilsesquioxane resin, other essential constituents of the compositions include film-modifier, catalyst, photoacid generator, quencher, additives, and solvents.

The function of film-modifier is to control diffusion of catalysts, photoacid generator and quencher in the film. Polysiloxane and polysilsesquioxane films are known porous media. Small molecules of catalysts, photoacid generators and quenchers have high mobility in the films driven by diffusion force. In photoresist films, moderate diffusion is needed to achieve smooth and straight pattern sidewalls. Too much diffusion compromises profiles of photoacid generator distribution defined by exposure. Because of high diffusibility, films of polysiloxane and polysilsesquioxane have been considered not appropriate for delineating high-resolution images. Indeed, negative-tone photoresist of polysiloxane or polysilsesquioxane is yet to make its commercial debut, although the chemistry is quite intuitive. Film-modifier is based on a novel concept to control the diffusion. Film modification for diffusion control is very important to the success of making silicon hardmasks photo-imageable with high resolution.

Diffusion control in prior art emphasized primarily on molecule dimensions of photoacid generators and post-exposure-bake temperatures. Neither method is applicable to polysiloxane and polysilsesquioxane resins. Inventors of the present invention observed significant diffusion of catalysts, photoacid generators and quenchers in polysiloxane or polysilsesquioxane films even at ambient temperatures. Film-modifier is based on the concept of constraining diffusion pathways of catalysts, photoacid generators, any other small-molecule components.

Film-modifiers are selected from polymers, oligomers, or non-polymeric compounds. Weight-average molecular weight of polymers or oligomers is preferably lower than 5,000 grams per mole, and more preferably lower than 2,000 grams per mole. Molecules of film-modifiers have to be small enough to fill in the film pores. Film-modifier may be a hydrocarbon compound, but preferably a silicon-containing compound. At least one hydroxyl group is attached to each molecule of film-modifiers. The hydroxyl groups participate condensation reactions of the film resin in the delineating process. Exemplary hydrocarbon film-modifiers include polyols such as 1,1,1-tris(hydroxymethyl)ethane and pentaerythritol. Exemplary silicon-based modifiers include silanols such as diphenylsilanediol. Film-modifier should not exceed 30%, and more preferably 10%, of the resin by weight. Concentrations of film-modifier in compositions are used to control diffusion length of catalysts, photoacid generators, and quenchers. Multiple film-modifiers may be used in one composition.

Suitable catalysts must meet two criteria: (1) Capable of catalyzing condensation reactions of polysiloxane and polysilsquioxane; (2) Easy to be deactivated by photo-generated acid. Deactivated catalyst loses capabilities of catalyzation. A variety of compounds are qualified as the catalyst, since condensation reactions of polysiloxane and polysilsquioxane can be catalyzed by both base and acid. Quaternary ammonium salts, such as benzyltriethylammonium chloride (BTEAC), tetramethylammonium chloride (TMAC), and tetramethylammonium hydroxide (TMAH), are proven efficient as the catalyst. Amines, such as triethanol amine, are tested candidates as well. Catalyst load in compositions of the photo-imageable hardmask is preferably from 0.005% to 0.2%. Catalyst weight is preferably from 0.1% to 4% of the resin.

Unlike prior art, photoacid generator is not a catalyst in the film of photo-imageable hardmask. Function of photoacid generator is simply to deactivate the catalyst. Deactivation is accomplished by rapid and thorough reactions such as neutralization between base and acid. Photoacid generators are compounds that release acid upon exposure to radiations with desired wavelengths. All known photoacid generators for compositions of de-protection photoresist are practically applicable to photo-imageable hardmasks. Consideration shall be given to the diffusion aspect of photoacid generators in polysiloxane and plysilsesquioxane films. Suitable photoacid generators include onium salts such as sulfonium and iodinium salts. Sulfonium salts are compounds of sulfonium cations and sulfonates or methides. Exemplary sulfonium cations include triphenylsulfonium and tris(4-tert-butoxyphenyl)sulfonium. Exemplary sulfonates include trifluoromethanesulfonate and perfluoro-1-butanesulfonate. Exemplary methides include tris(trifluoromethyl)methide. Iodinium salts are compounds of iodonium cations and sulfonates. Exemplary iodinium cations are aryliodonium cations including diphenyliodinium and bis(4-tert-butylphenyl) iodonium. Exemplary sulfonates include trifluoromethanesulfonate and perfluoro-1-butanesulfonate. Triphenylsulfonium tris(trifluoromethyl)methide is an especially important photoacid generator for compositions of the positive-tone photo-imageable hardmask. Molar ratio of photoacid generator to catalyst is preferably 0.5 to 1.5.

Quencher in compositions of the photo-imageable hardmask has two functions. One is to control photospeed at reasonable levels by neutralizing unwanted photo-generated acid. Another is to counteract the diffusion of photoacid generators. A variety of amines are suitable quenchers for the positive-tone photo-imageable hardmask. Tested and proved quenchers include n-boc-piperidine, t-butyl 4-hydroxy-1-piperidinecarboxylate, triethanol amine, 1-piperidineethanol, and benzyltriethylammonium chloride. Molar ratio of quencher to photoacid generator is preferably from 0.2 to 10.

Suitable solvents for the compositions of positive-tone photo-imageable hardmask include, but are not limited to, propylene glycol methyl ether (PGME), propylene glycol methyl ether acetate (PGMEA), and ethyl lactate (EL).

The compositions of positive-tone hardmask are formulated by mixing the ingredients under agitation. When all the solid chemicals dissolved, the compositions are filtered through membranes with 0.02-micrometer pores. Solid content of the compositions of positive-tone photo-imageable hardmask is between 1% and 10%.

The compositions of positive-tone photo-imageable hardmask are applied on substrates preferably by spin-coating to form uniformed films. Spin speed can range from 1500 revolution per minute to 5000 revolution per minute. Spin-formed films of the positive-tone photo-imageable hardmask need to be dried on a hotplate surface of preferably 40° C.-120° C., and more preferably 60° C.-100° C., for preferably 30 seconds to 120 seconds, and more preferably 30 seconds to 60 seconds. The dried films of positive-tone photo-imageable hardmask are soluble in developers.

Elemental silicon constitutes 30%-41%, and more commonly 35%-40%, of dried films of photo-imageable hardmask by weight. As a reference, pure silicon dioxide is consisted of 46.7% silicon. The silicon-rich photo-imageable hardmask is highly resistant to attacks from oxygen, chlorine, and HBr plasmas.

Film thickness is adjustable by viscosity of the compositions, and speed of spin-coating. For processes of photolithographic patterning, film thickness may range from 10 nanometers to 100 nanometers, and more preferably from 40 nanometers to 100 nanometers. Refractive index (n) of the films is preferably from 1.4-1.9, and more preferably from 1.5-1.8. Extinction coefficient (k) of the films is preferably from 0.01 to 0.4.

The positive-tone photo-imageable hardmask is ready for radiation exposure immediately after post-application bake. Suitable radiation source for the exposure may have a wavelength that is commonly used in the field of invention, such as 365 nanometers, 248 nanometers, 193 nanometers, and 13.5 nanometers. In general, radiations with wavelengths shorter than 400 nanometers are preferred. A photomask with desired chrome patterns is placed between radiation source and surface of the photo-imageable hardmask. Image of the patterns is projected onto the hardmask surface. The image may not be visible to naked eyes, but radiation contrast with "bright" and "dark" regions are defined.

If the space between projection lens of the exposure tool and surface of the photo-imageable hardmask is filled with a fluid, known as immersion lithography in the field of invention, a top-coat may be needed. The top-coat may preserve the physicochemical properties of the photo-imageable hardmask surface, in addition to reduce risks of leaching from the hardmask.

Thermal treatment on a hotplate surface is necessary immediately after exposure. Appropriate bake temperatures are preferably 60° C.-120° C., and more preferably 80° C.-100° C., for preferably 30 seconds to 120 seconds, and more preferably 30 seconds to 60 seconds. The post-exposure bake (PEB) accelerates crosslinking reactions of the resin, and deactivation reactions of the catalyst.

In dark regions of the exposure, not enough acid is generated to deactivate the catalyst. The catalyst is able to promote condensation reactions of the polysiloxane and polysilsesquioxane resin. The condensation reactions may start at ambient temperature, but complete after the post-exposure bake. The condensation reactions create inter- and intra-molecule linkage bonds in the format of "—Si—O—". The film in dark regions is therefore crosslinked and becomes insoluble in developers. In other words, the photo-imageable hardmask is not soluble without exposure to radiations.

In bright regions of the exposure, enough acid is generated from radiations to deactivate entire or most part of the catalyst. "Deactivation" herein is a common terminology for any reactions, including neutralization between acid and base, that disable the functionality of the catalyst. Such reactions can be very rapid and thorough. The deactivation reactions may produce water or volatile byproducts. Deactivation may start at ambient temperature and complete at the temperature of post-exposure bake. How much catalyst is deactivated depends on photoacid generator load in the compositions and radiation dosage of the exposure. When enough catalyst is deactivated, condensation reactions will not take place in the resin. Molecular network is not formed in the bright regions of the film. As such, the radiated portions of the photo-imageable hardmask remain soluble in developers. Positive-tone images are formed. Deactivation is obviously an alternative mechanism from de-protection to form positive-tone images. Deactivation and de-protection rely on different types of chemical reactions. Deactivation takes place between catalyst and photoacid generator. De-protection takes place on resins. One remarkable advantage of the deactivation mechanism is that silicon content in resins can be very high.

Suitable developers for the positive-tone photo-imageable hardmask may be organic solvents or alkaline aqueous solutions. The latter is more preferable. Preferred organic solvents include, but are not limited to, propylene glycol methyl ether (PGME), propylene glycol methyl ether acetate (PGMEA), ethyl lactate (EL), and cyclohexanone. Preferred alkaline developers may be water solutions of organic or inorganic bases, including tetramethylammonium hydroxide (TMAH), potassium hydroxide, and sodium hydroxide. The most preferable developer is aqueous solutions of tectramethylammonium hydroxide with concentrations ranging from 2.5 to 25 grams per liter.

Photo-imageable hardmask of the present invention is capable of forming precursor patterns on semiconductor substrates with or without an intermediate layer. Intermediate layer is a coating of organic polymers with a thickness between 100 nanometers and 500 nanometers. Intermediate layer functions as a mask to protect substrates from plasma etch. It serves as an antireflective coating as well. If intermediate layer is not needed, a thin antireflective coating is used to control reflection of radiations from substrates. Antireflective coating has a thickness between 20 nanometers and 80 nanometers. This thin layer is not an etch mask.

Figure 2A:
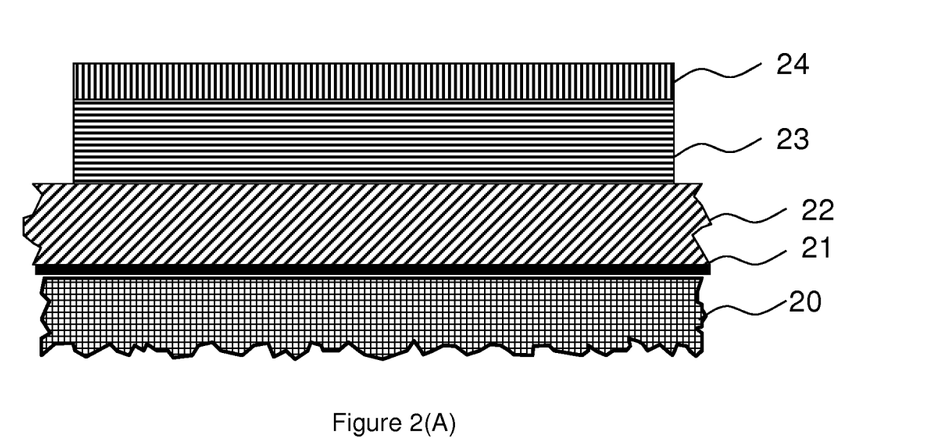
FIG. 2(A): Film stack for positive-tone photo-imageable hardmask process with an intermediate layer.

FIG. 2(A) shows film stack of one embodiment that the positive-tone photo-imageable hardmask was used in conjunction with an intermediate layer. The intermediate layer (23) was formed by spin-coating a composition on a polysilicon substrate (22) which was on an etch-stop layer (21). The carrier of the films is a silicon wafer (20). The substrate can be any of the common materials used in integrated circuitry (IC) fabrication, such as polysilicon, dielectrics, and metals. The substrate may have a flat or topographic surface. The intermediate layer (23) was cured on a hotplate surface of 200° C. for 60 seconds. Thickness of the intermediate layer (23) was 320±10 nanometers.

A composition of positive-tone photo-imageable hardmask was spin-coated on top of intermediate layer (23), and followed by a bake on a hotplate surface of 60° C. for 90 seconds. The photo-imageable hardmask (24) had a thickness of 56±5 nanometers.

Figure 2B:
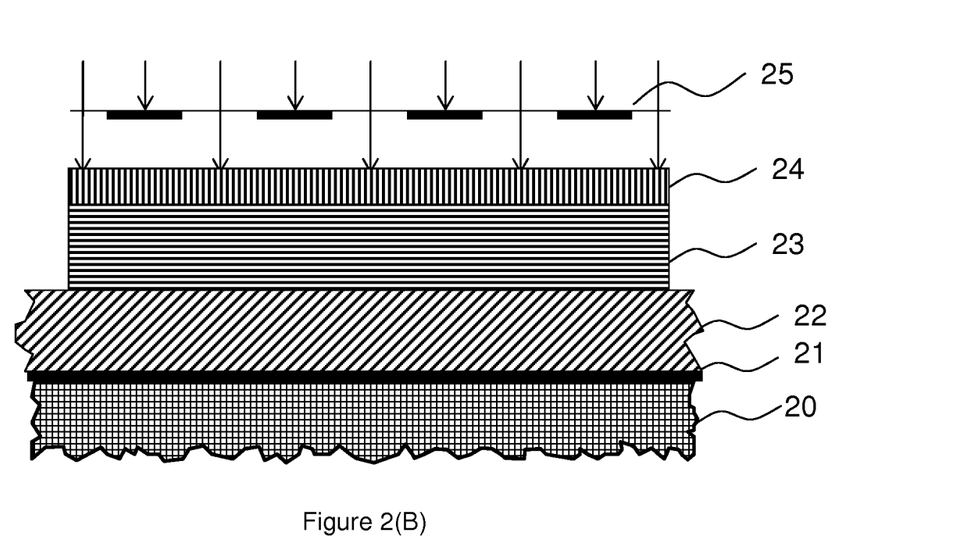
FIG. 2(B): Positive-tone photo-imageable hardmask being exposed to radiations with a photomask.
Figure 2C:
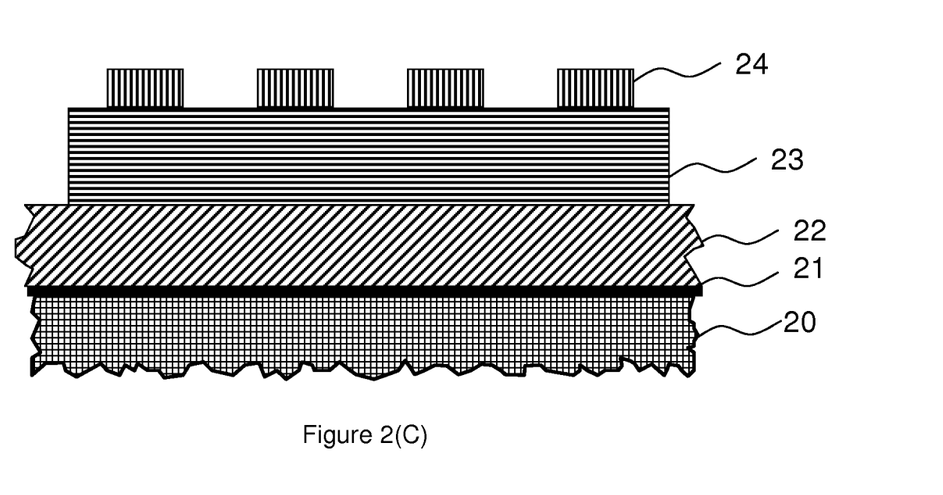
FIG. 2(C): Cross-section view of positive-tone patterns formed on photo-imageable hardmask.

FIG. 2(B) shows the positive-tone photo-imageable hard mask (24) being exposed to radiations with a photomask (25). Pattern images on the photomask (25) were projected on surface of the photo-imageable hardmask (24). The radiation had a wavelength of 193 nanometers. The exposure was followed by a bake on a hotplate surface of 100° C. for 90 seconds. The wafer was then submerged in an aqueous solution of tetramethylammonium hydroxide with a concentration of 4.7 grams per liter for development. Radiated portions of the photo-imageable hardmask dissolved in the developer. Positive-tone patterns (in FIG. 2(C)) formed on the photo-imageable hardmask (24).

Figure 2D:
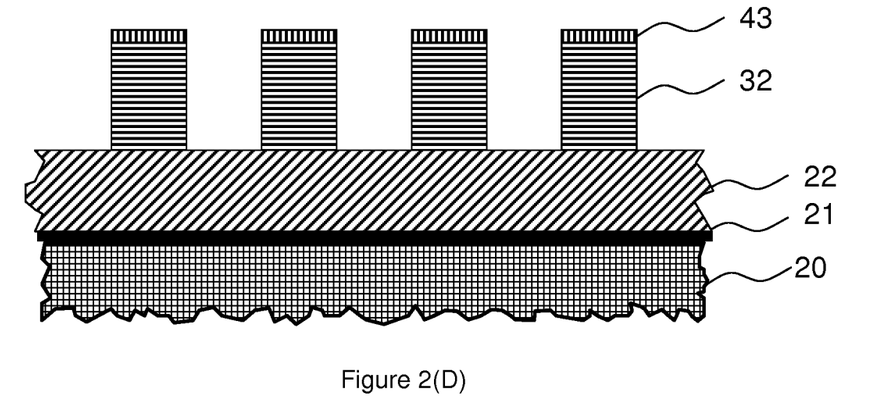
FIG. 2(D): Cross-section view of patterns on intermediate layer with residual photo-imageable hardmask formed by plasma etch.

FIG. 2(D) shows that patterns on the photo-imageable hardmask (24) were transferred to the intermediate layer (23) by oxygen-containing plasma. Portions of the intermediate layer (23) that were subjected to plasma were removed. Portions of the intermediate layer (23) that were protected by the photo-imageable hard mask (24) were intact. Residual photo-imageable hard mask (24) was still visible.

Figure 2E:
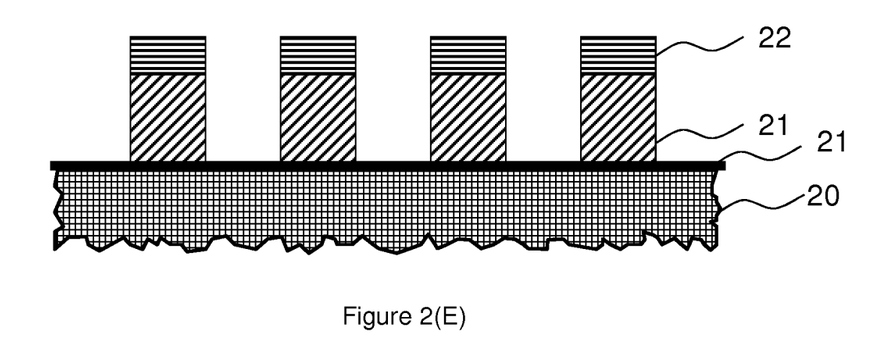
FIG. 2(E): Cross-section view of patterns on substrate with residual intermediate layer formed by plasma etch.

FIG. 2(E) shows that patterns on the intermediate layer (23) were transferred to the substrate (22) by chlorine-containing plasma. Portions of the substrate (22) that were subjected to plasma were removed. Portions of the substrate (22) that were protected by the intermediate layer (23) were intact. Residual intermediate layer (23) was still visible.

Figure 3A:
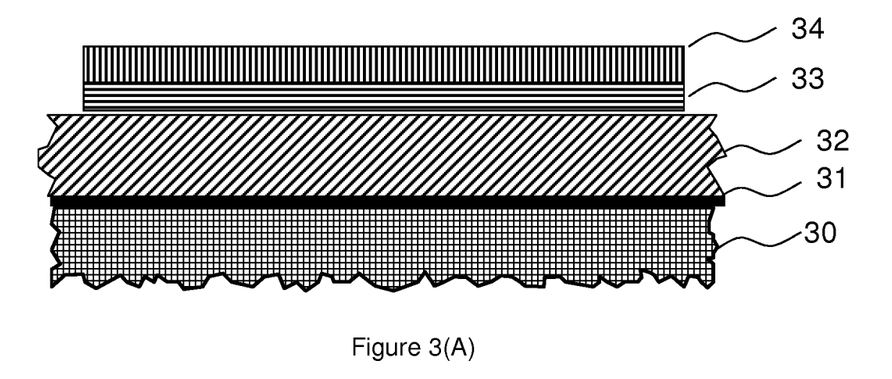
FIG. 3(A): Film stack for positive-tone photo-imageable hardmask process with thin antireflective coating.

FIG. 3(A) shows film stack of another embodiment that the positive-tone photo-imageable hardmask was used in conjunction with a thin anti-reflective coating (ARC). The antireflective coating (33) was formed by spin-coating a composition on a polysilicon substrate (32) which was on an etch-stop layer (31). The carrier of the films was a silicon wafer (30). The substrate can be any of the common materials used in integrated circuitry (IC) fabrication, such as polysilicon, dielectrics, and metals. The substrate may have a flat or topographic surface. The antireflective coating was cured on a hotplate surface of 200° C. for 60 seconds. The antireflective coating (33) had a thickness of 32±2 nanometers that was optimal for reflectivity control. The thin antireflective coating (33) did not serve as an etch mask.

A composition of the positive-tone photo-imageable hardmask was spin-coated on top of the ARC layer (33), and followed by a bake on a hotplate surface of 60° C. for 90 seconds. The photo-imageable hardmask film (34) had a thickness of 56±5 nanometers.

Figure 3B:
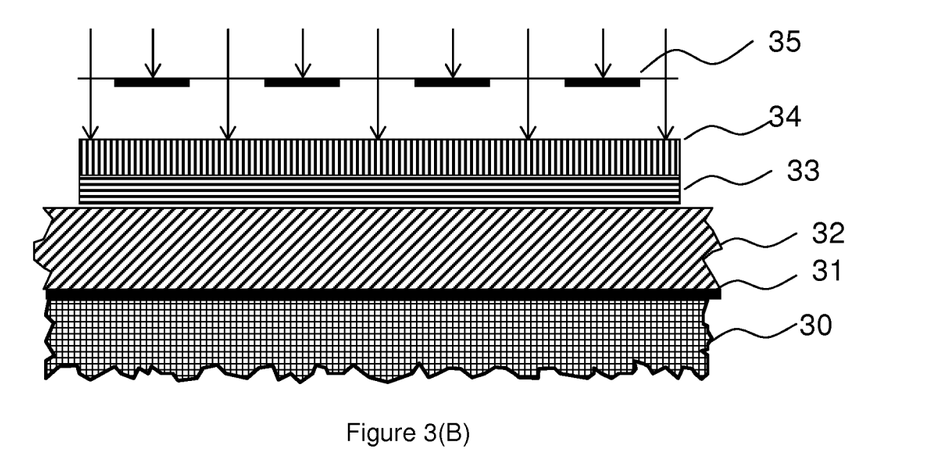
FIG. 3(B): Positive-tone photo-imageable hardmask being exposed to radiations with a photomask.
Figure 3C:
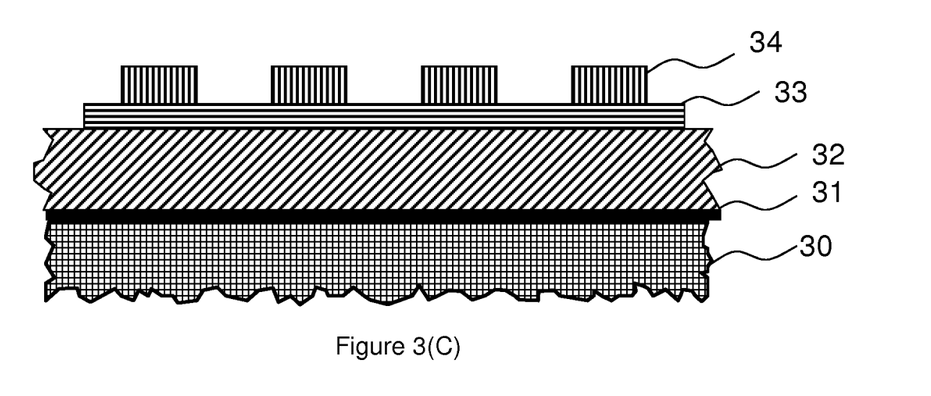
FIG. 3(C): Cross-section view of positive-tone patterns formed on photo-imageable hardmask.

FIG. 3(B) shows the positive-tone photo-imageable hard mask (34) being exposed to radiations with a photomask (35). Pattern images on the photomask (35) were projected on surface of the photo-imageable hardmask (34). The radiation had a wavelength of 193 nanometers. The exposure was followed by a bake on a hotplate surface of 100° C. for 90 seconds. The wafer was submerged in an aqueous solution of tetramethylammonium hydroxide with a concentration of 4.7 grams per liter for development. Radiated portions of the photo-imageable hardmask dissolved in the developer. Positive-tone patterns (in FIG. 3(C)) formed on the photo-imageable hardmask (34).

Figure 3D:
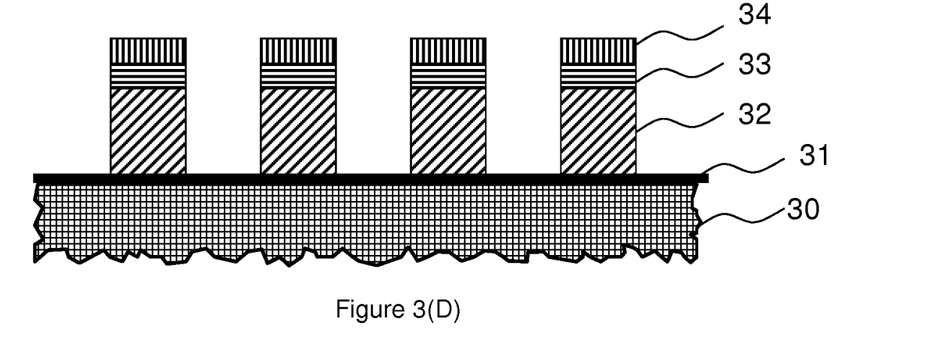
FIG. 3(D): Cross-section view of patterns on substrate with antireflective coating and residual photo-imageable hardmask formed by plasma etch.

FIG. 3(D) shows that patterns on the photo-imageable hardmask (34) were transferred to the substrate (32) by oxygen- and chlorine-containing plasma. Portions of the antireflective coating (33) and substrate (32) that were subjected to plasma were removed. Portions of the antireflective coating (33) and substrate (32) that were protected by the photo-imageable hardmask (34) were intact. The antireflective coating (33) was punched through by plasma due to the thin thickness and fast etch rate. Residual photo-imageable hardmask (33) was still visible.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of Polysiloxane and Polysilsesquioxane Resin I

TABLE 1

| Monomers for Polysiloxane and Polysilsesquioxane Resin I: | |
| --- | --- |
| Methyl trimethoxy silane (Gelest, Morrisville, PA) | 65.2 grams |
| Tetraethoxy silane (Gelest, Morrisville, PA) | 26.6 grams |
| Phenyl trimethoxy silane (Gelest, Morrisville, PA) | 5.06 grams |
| 2-(3,4-Epoxycyclohexyl)ethyl trimethoxy silane (Gelest, Morrisville, PA) | 1.57 grams |

Monomers in Table 1, together with 80 grams of propylene glycol methyl ether acetate (from Sigma Aldrich (Milwaukee, Wis.)), were mixed in a 500-mL three-neck round-bottom flask. Attached to the flask were distillation condenser, thermometer, and nitrogen inlet. Nitrogen flow was set at 200 milliliters per minute. With stirring, temperature of the mixture in the flask was raised to 95° C. in oil bath. Then, 50 grams of 3-nomal acetic acid were slowly added to the flask. Condensation reactions began. Volatile byproducts were distilled out of the flask and collected. Distillation completed in four hours. Heating stopped immediately after distillation is finished. Totally 96 grams of distillate were collected. Fresh propylene glycol methyl ether acetate of 164 grams was immediately added to the flask to reduce temperature. Final content of the flask was used, as Resin I, for compositions of the positive-tone photo-imageable hardmask without further processing.

Example 2

Synthesis of Polysiloxane and Polysilsesquioxane Resin II

TABLE 2

| Monomers for Polysiloxane and Polysilsesquioxane Resin II: | |
| --- | --- |
| Methyl trimethoxy silane (Gelest, Morrisville, PA) | 67.8 grams |
| Tetraethoxy silane (Gelest, Morrisville, PA) | 26.6 grams |
| 2-(3,4-Epoxycyclohexyl)ethyl trimethoxy silane (Gelest, Morrisville, PA) | 3.14 grams |

Monomers in Table 2, together with 80 grams of propylene glycol methyl ether acetate (from Aldrich, Milwaukee, Wis.), were mixed in a 500-mL three-neck round-bottom flask.

Attached to the flak were distillation condenser, thermometer, and nitrogen inlet. Nitrogen flow was set at 200 milliliters per minute. With stirring, temperature of the mixture in the flask was raised to 95° C. in oil bath. Then, 50 grams of 3-normal acetic acid were slowly added to the flask. Condensation reactions began. Volatile byproducts were distilled out of the flask and collected. Distillation completed in four hours. Heating stopped immediately after distillation is finished. Totally 94.4 grams of distillate were collected. Fresh propylene glycol methyl ether acetate of 154 grams was immediately added to the flask to reduce temperature. Final content of the flask was used, as Resin II, for compositions of the positive-tone photo-imageable hardmask without further processing.

Example 3

Synthesis of Polysiloxane and Polysilsesquioxane Resin III

TABLE 3

| Monomers for Polysiloxane and Polysilsesquioxane Resin III: | |
| --- | --- |
| Methyl trimethoxy silane (Gelest, Morrisville, PA) | 66.2 grams |
| Tetraethoxy silane (Gelest, Morrisville, PA) | 26.6 grams |
| Phenyl trimethoxy silane (Gelest, Morrisville, PA) | 5.06 grams |

Monomers in Table 3, together with 80 grams of propylene glycol methyl ether acetate (from Sigma Aldrich (Milwaukee, Wis.)), were mixed in a 500-mL three-neck round-bottom flask. Attached to the flask were distillation condenser, thermometer, and nitrogen inlet. Nitrogen flow was set at 200 milliliters per minute. With stirring, temperature of the mixture in the flask was raised to 95° C. in oil bath. Then, 50 grams of 3-nomal acetic acid were slowly added to the flask. Condensation reactions began. Volatile byproducts were distilled out of the flask and collected. Distillation completed in four hours. Heating stopped immediately after distillation is finished. Totally 102 grams of distillate were collected. Fresh propylene glycol methyl ether acetate of 164 grams was immediately added to the flask to reduce temperature. Final content of the flask was used, as Resin III, for compositions of the positive-tone photo-imageable hardmask without further processing.

Example 4

Positive-Tone Photo-Imageable Hardmask Composition I

TABLE 4

| Ingredients of Positive-tone Photo-imageable Hardmask Composition I | |
| --- | --- |
| Resin I (from Example 1) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.04 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition I was made by mixing the ingredients in Table 4. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of catalyst, that is benzyltriethylammonium chloride, to photo-acid generator, that is triphenylsulfonium tris(trifluoromethyl)methide, is 1. Catalyst load is 0.014% of total composition weight.

Lithographic Conditions for Composition I:

| | |
| --- | --- |
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition I after post-exposure bake is consisted of 36% or more silicon by weight.

Example 5

Positive-Tone Photo-Imageable Hardmask Composition II

TABLE 5

| Ingredients of Positive-tone Photo-imageable Hardmask Composition II | |
| --- | --- |
| Resin II (from Example 2) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.04 grams |
| t-Butyl 4-hydroxy-1-piperidinecarboxylate (Aldrich, Milwaukee, WI) | 0.06 grams |
| Benzyltriethylammonium chloride (Aldrich, Milwaukee, (WI) | 0.02 grams |
| Propylene glycol methyl ether acetate | 100 grams |

Composition II was made by mixing the ingredients in Table 5. When all the solids dissolved, the composition was filtered through a membrane with 0.02-micrometer pores. In the composition, film-modifier, that is (1,1,1-tris(hydroxymethyl)ethane), is 2.7% of the resin by weight. Molar ratio of catalyst, that is benzyltriethylammonium chloride, to photo-acid generator, that is triphenylsulfonium tris(trifluoromethyl)methide), is 1. Catalyst load is 0.014% of total composition weight.

Lithographic Conditions for Composition II:

| | |
| --- | --- |
| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition II after post-exposure bake is consisted of 38% or more silicon by weight.

Example 6

Positive-Tone Photo-Imageable Hardmask Composition III

TABLE 6

| Ingredients of Positive-tone Photo-imageable Hardmask Composition III | |
|---|---|
| Resin I (from Example 1) | 39 grams |
| 1,1,1-Tris(hydroxymethyl)ethane (Aldrich, Milwaukee, WI) | 0.1 grams |
| Triphenylsulfonium triflate (Aldrich, Milwaukee, WI) | 0.024 grams |
| t-Butyl 4-hydroxy-1-piperidinecarboxylate (Aldrich, Milwaukee, WI) | 0.06 grams |
| Benzyltriethylammonium chloride (Aldrich, Milwaukee, (WI) | 0.02 grams |
| Propylene glycol methyl ether acetate | 100 grams |

Composition III was made by mixing the ingredients in Table 6. When all the solids dissolved, the composition was filtered through a membrane with 0.02-micrometer pores. In the composition, film-modifier, that is 1,1,1-Tris(hydroxymethyl)ethane), is 2.7% of the resin by weight. Molar ratio of catalyst, that is benzyltriethylammonium chloride, to photo-acid generator, that is triphenylsulfonium triflate, is 3 to 2. Catalyst load is 0.014% of total composition weight.
Lithographic Conditions for Composition III:

| Wafer spin speed for coating | 1500-3000 revolutions per minute for film thickness of 40-60 nanometers |
|---|---|
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition III after post-exposure bake is consisted of 36% or more silicon by weight.

Example 7

Positive-Tone Photo-Imageable Hardmask Composition IV

TABLE 7

| Ingredients of Positive-tone Photo-imageable Hardmask Composition IV | |
|---|---|
| Resin II (from Example 2) | 39 grams |
| 1,1,1-Tris(hydroxymethyl)ethane (Aldrich, Milwaukee, WI) | 0.1 grams |
| Triphenylsulfonium triflate (Aldrich, Milwaukee, WI) | 0.024 grams |
| t-Butyl 4-hydroxy-1-piperidinecarboxylate (Aldrich, Milwaukee, WI) | 0.06 grams |
| Benzyltriethylammonium chloride (Aldrich, Milwaukee, (WI) | 0.02 grams |
| Propylene glycol methyl ether acetate | 100 grams |

Composition IV was made by mixing the ingredients in Table 7. When all the solids dissolved, the composition was filtered through a membrane with 0.02-micrometer pores. In the composition, film-modifier, that is 1,1,1-tris(hydroxymethyl)ethane, is 2.7% of the resin by weight. Molar ratio of catalyst, that is benzyltriethylammonium chloride, to photo-acid generator, that is triphenylsulfonium triflate, is 3 to 2. Catalyst load is 0.014% of total composition weight.
Lithographic Conditions Composition IV

| Wafer spin speed for coating | 1500-3000 revolutions per minute for film thickness of 40-60 nanometers |
|---|---|
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition IV after post-exposure bake is consisted of 38% or more silicon by weight.

Example 8

Positive-Tone Photo-Imageable Hardmask Composition V

TABLE 8

| Ingredients of Positive-tone Photo-imageable Hardmask Composition V | |
|---|---|
| Resin I (from Example 1) | 39 grams |
| 1,1,1-Tris(hydroxymethyl)ethane (Aldrich, Milwaukee, WI) | 0.1 grams |
| Triphenylsulfonium perfluoro-1-butanesulfonate (Aldrich, Milwaukee, WI) | 0.034 grams |
| t-Butyl 4-hydroxy-1-piperidinecarboxylate (Aldrich, Milwaukee, WI) | 0.06 grams |
| Benzyltriethylammonium chloride (Aldrich, Milwaukee, (WI) | 0.02 grams |
| Propylene glycol methyl ether acetate | 100 grams |

Composition V was made by mixing the ingredients in Table 8. When all the solids dissolved, the composition was filtered through a membrane with 0.02-micrometer pores. In the composition, film-modifier, that is 1,1,1-tris(hydroxymethyl)ethane, is 2.7% of the resin by weight. Molar ratio of catalyst, that is benzyltriethylammonium chloride, to photo-acid generator, that is triphenylsulfonium perfluoro-1-butanesulfonate, is 3 to 2. Catalyst load is 0.014% of total composition weight.
Lithographic Conditions for Composition V:

| Wafer spin speed for coating | 1500-3000 revolutions per minute for film thickness of 40-60 nanometers |
|---|---|
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition V after post-exposure bake is consisted of 36% or more silicon by weight.

Example 9

Positive-Tone Photo-Imageable Hardmask Composition VI

TABLE 9

Ingredients of Positive-tone Photo-imageable Hardmask Composition VI

| Resin I (from Example 1) | 39 grams |
| Diphenylsilanediol (Gelest, Morrisville, PA) | 0.2 grams |
| Triphenylsulfonium tris(trifluoromethyl)methide (Ciba, Basel, Switzerland) | 0.04 grams |
| Benzyltriethylammonium chloride (Aldrich, Milwaukee, (WI) | 0.02 grams |
| Propylene glycol methyl ether acetate | 100 grams |

Composition VI was made by mixing the ingredients in Table 9. When all the solids dissolved, the composition was filtered through a membrane with 0.02-micrometer pores. In the composition, film-modifier, that is diphenylsilanediol, is 5.5% of the resin by weight. Molar ratio of catalyst, that is benzyltriethylammonium chloride, to photoacid generator, that is triphenylsulfonium tris(trifluoromethyl)methide, is 1. Catalyst load is 0.014% of total composition weight.
Lithographic Conditions for Composition VI:

| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition VI after post-exposure bake is consisted of 36% or more silicon by weight.

Example 10

Positive-Tone Photo-Imageable Hardmask Composition VII

TABLE 10

Ingredients of Positive-tone Photo-imageable Hardmask Composition VII

| Resin III (from Example 3) | 39 grams |
| 1,1,1-Tris(hydroxymethyl)ethane (Aldrich, Milwaukee, WI) | 0.1 grams |
| Triphenylsulfonium tris(trifluoromethyl)methide (Ciba, Basel, Switzerland) | 0.04 grams |
| t-Butyl 4-hydroxy-1-piperidinecarboxylate (Aldrich, Milwaukee, WI) | 0.06 grams |
| Benzyltriethylammonium chloride (Aldrich, Milwaukee, WI) | 0.02 grams |
| Propylene glycol methyl ether acetate | 100 grams |

Composition VII was made by mixing the ingredients in Table 10. When all the solids dissolved, the composition was filtered through a membrane with 0.02-micrometer pores. In the composition, film-modifier, that is 1,1,1-tris(hydroxymethyl)ethane), is 2.7% of the resin by weight. Molar ratio of catalyst, that is benzyltriethylammonium chloride to photoacid generator, that is triphenylsulfonium tris(trifluoromethyl)methide, is 1. Catalyst load is 0.014% of total composition weight.
Lithographic Conditions for Composition VII:

| Wafer spin speed for coating | 1500-3000 revolutions per minute for film thickness of 40-60 nanometers |
| Post-application bake | 60-100° C. for 60 seconds |
| Suitable radiation wavelengths | 193 nanometers and 13.5 nanometers |
| Post-exposure bake | 60-120° C. for 90 seconds |
| Development | 10 seconds to 40 seconds in 4.8 grams of tetramethylammonium hydroxide per liter aqueous solution by spray, puddling or submerge |

Film of Composition VII after post-exposure bake is consisted of 38% or more silicon by weight.

What is claimed is:

1. A method of photoimaging silicon hardmask films with a positive tone, and the method comprising:
   (i) incorporating a catalyst and a photoacid generator into a polysiloxane and polysilsesquioxane based hardmask composition, said catalyst being:
      capable of catalyzing condensation reactions to resin molecules of said polysiloxane and polysilsesquioxane based hardmask films, said condensation reactions forming inter- and intra-molecule linkage bonds, said linkage bonds forming molecular networks, and said molecular network making hardmask films insoluble in organic solvents or alkaline aqueous solutions, and
      easy to be deactivated by photo-generated acids, and deactivated catalyst loses capability of catalyzing said condensation reactions,
   and said photoacid generator being a chemical compound capable of producing acid upon exposure to radiations, said acid being able to deactivate said catalyst, and said radiations having wavelengths of 400 nanometers and shorter,
   (ii) radiating said polysiloxane and polysilsesquioxane based hardmask films with photomask images, said radiation causing:
      said photoacid generator being radiated in bright areas of said photomask images, radiated photoacid generator generating acid, said acid deactivating said catalyst, condensation reactions not taking place due to lack of active catalyst, and hard mask films in said bright areas being removed by organic solvents or alkaline aqueous solutions,
      and said photoacid generator not being radiated in dark areas of said photomask images, unradiated photoacid generator generating no acid, catalyst not being deactivated, condensation reactions taking place, and said hardmask films in said dark areas being not soluble in organic solvents or alkaline aqueous solutions.

2. The method of claim 1, wherein said condensation reactions taking place in said silicon hardmask films when being baked at temperatures between 60° C. and 120° C.

3. A method of modifying films for desired diffusion length of catalysts, photoacid generators, and quenchers in photo-imageable silicon hardmasks, said method comprising of:
   incorporating a film-modifier into compositions of said photo-imageable silicon hardmask, said film-modifier comprising polyols or silanols, said polyols comprising 1,1,1-tris(hydroxymethyl)ethane or pentaerythritol, and said silanols comprising diphenylsilanediol, and bonding film-modifier molecules to resin of said photo-imageable silicon hardmask films, said bonding taking place at ambient or higher temperatures.

4. Compositions of photo-imageable hardmask with positive tone, said compositions comprising of:

polymeric resin, said resin is prepared from monomers with molecular structures of wherein R is selected from groups consisting of hydrogen and $C_1$-$C_4$ alkyls, and $R_1$ is selected from groups consisting of alkyl, aryl, alkene, alicyclic, epoxy-alkyl, and epoxy-cycloalkyl, and polymerization taking place to said monomers with presence of catalysts in organic solvents under temperatures from 80° C. to 110° C., and volatile alkanols being formed and removed, and polysiloxanes and polysilsesquioxanes being formed with molecular structures of wherein R is selected from groups consisting of hydrogen and $C_1$-$C_4$ alkyls, and $R_1$ is selected from groups consisting of alkyl, aryl, alkene, alicyclic groups, epoxy-alkyl, and epoxy-cycloalkyl, and a catalyst, said catalyst being selected from a group of chemical compounds able to accelerate condensation reactions to said resin, and said chemical compounds comprising quaternary ammonium salts or amines, and said catalyst being readily deactivated by photo-generated acids, and said compositions comprising of 0.005% to 0.2% of said catalyst by weight, and a photoacid generator, said photoacid generator comprising onium salts, and molar ratio of said photoacid generator to said catalyst being 0.5 to 1.5, and a film-modifier, said film-modifier comprising polyols or silanols, said polyols comprising 1,1,1-tris(hydroxymethyDethane or pentaerythritol, and said silanols comprising diphenylsilanediol, and a quencher, said quencher is selected from alkaline compounds, said alkaline compounds being capable of neutralizing photo-generated acid, and said alkaline compounds comprising n-boc-piperidine, t-butyl 4-hydroxy-1-piperidinecarboxylate, triethanol amine, 1-piperidineethanol, or benzyltriethylammonium chloride, and molar ratio of said quencher to said photoacid generator is 0.2-10, and a solvent or mixture of solvents, said solvents comprising propylene glycol methyl ether, propylene glycol methyl ether acetate or ethyl lactate.

5. The compositions of claim 4, wherein said polymer resin and other solid chemicals making up less than ten percent of total composition weight.

6. The compositions of claim 4, wherein said photo-imageable hardmask consisting of 30%-41% silicon in dry films.

7. A process of forming precursor structures on semiconductor substrates using positive-tone photo-imageable hardmask in conjunction with an intermediate layer, said process comprising of:

forming an intermediate layer on a semiconductor substrate by spin-coating a composition, said composition comprising of at least a hydrocarbon resin and a solvent, and said semiconductor substrate comprising polysilicon, dielectrics or metals, and said semiconductor substrate having a flat surface or structured surface, and curing said intermediate layer on a hot surface, and cured intermediate layer having a thickness from 100 nanometers to 500 nanometers, and forming a film of positive-tone photo-imageable hardmask on said intermediate layer by spin-coating a composition of claim 4, and drying film of said positive-tone photo-imageable hardmask on a hotplate surface, said hotplate surface having a temperature between 40° C. and 100° C., and dried film of positive-tone photo-imageable hardmask having a thickness between 20 nanometers and 100 nanometers, and exposing said film of positive-tone photo-imageable hardmask to a radiation with image contrast, said radiation having a wavelength shorter than 400 nanometers, and conditioning exposed film of photo-imageable hardmask on a heated surface, said heated surface having a temperature between 60° C. and 120° C., and removing radiated portions of said image contrast of said film of positive-tone photo-imageable hardmask by organic solvents or alkaline aqueous solutions, said alkaline aqueous solutions comprising tetramethylammonium hydroxide water solutions, and said removing method being chosen from submerge and spray, and said removing process yielding images on said film of positive-tone photo-imageable hardmask, and removing portions of said intermediate layer under open areas of said images on said positive-tone photo-imageable hardmask by plasma, said plasma comprising of gases having oxygen, and said removing process yielding images on said intermediate layer, and removing portions of said substrate under open areas of said images on said intermediate layer by plasma, said plasma comprising of gases chosen from chlorine, hydrogen bromide and fluorinated hydrocarbons, and said removing process yielding structures on said substrate.

8. A process of forming precursor structures on semiconductor substrates using positive-tone photo-imageable hardmask in conjunction with a thin antireflective coating, said process comprising of:

forming a thin antireflective coating on a semiconductor substrate by spin-coating a composition, said semiconductor substrate comprising polysilicon, dielectrics or metals, and said semiconductor substrate having a flat surface or structured surface, and curing said thin antireflective coating on a heated surface, and cured thin antireflective coating having a thickness from 20 nanometers to 80 nanometers, and forming a film of positive-tone photo-imageable hardmask on said antireflective coating by spin-applying a composition of claim 4, and drying film of said positive-tone photo-imageable hardmask on a heated surface, said heated surface having a temperature between 40° C. and 100° C., and dried film of positive-tone photo-imageable hardmask having a thickness between 20 nanometers and 100 nanometers, and exposing said film of positive-tone photo-imageable hardmask to a radiation with image contrast, said radiation having a wavelength shorter than 400 nanometers, and conditioning exposed film of positive-tone photo-imageable hardmask on a heated surface, said heated surface having a temperature between 60° C. and 120° C., and removing radiated portions from said image contrast of said film of positive-tone photo-imageable hardmask by organic solvents or alkaline aqueous solutions, said alkaline aqueous solutions comprising tetramethylammonium hydroxide water solutions, and said removing method being chosen from submerge and spray, and said removing process yielding images on said film of positive-tone photo-imageable hardmask, and removing portions of said antireflective coating and said substrate under open areas of said images on said positive-tone photo-imageable hardmask by plasma, said plasma comprising of gases chosen from oxygen, chlorine, hydrogen bromide and fluorinated hydrocarbons, and said removing process yielding structures on said substrate.

\* \* \* \* \*